United States Patent [19]

Scharfman

[11] 4,162,459
[45] Jul. 24, 1979

[54] MAGNETRON TUNING CIRCUIT

[75] Inventor: Howard Scharfman, Lexington, Mass.

[73] Assignee: Raytheon Company, Lexington, Mass.

[21] Appl. No.: 943,582

[22] Filed: Sep. 18, 1978

[51] Int. Cl.² .............................................. H03B 9/10
[52] U.S. Cl. ...................................... 331/90; 331/88; 332/5
[58] Field of Search ........................... 331/5, 6, 88, 90; 332/5; 325/121; 328/230

[56] References Cited

U.S. PATENT DOCUMENTS 3,178,652  4/1965  Scharfman et al. ..................... 331/5
3,701,020  10/1972  De Vito ................................... 331/5

FOREIGN PATENT DOCUMENTS 650665  10/1962  Canada ......................................... 331/5

Primary Examiner—John Kominski
Attorney, Agent, or Firm—David M. Warren; Joseph D. Pannone; Milton D. Bartlett

[57] ABSTRACT

A circuit for the modulation of the frequency of radiation produced by a magnetron includes a directional coupler connected to the output port of the magnetron, a circulator coupled between the output port and a load, and a phase shifter connected between the directional coupler and the circulator.

4 Claims, 2 Drawing Figures

MAGNETRON TUNING CIRCUIT

BACKGROUND OF THE INVENTION

Circuits, external to a magnetron, have been utilized for altering, or "pulling", the frequency of the electromagnetic radiation produced by the magnetron. One such circuit is shown in the U.S. Pat. No. 3,714,592 which issued in the name of Jory on Jan. 30, 1973. Therein, the output port of a magnetron is coupled via a circulator to a load. A variable phase shifter is coupled between the circulator and the load for varying the impedance reflected back to the magnetron and thereby pulling the frequency thereof.

A problem arises in that phase shifting circuitry in series with a load must necessarily operate with power levels commensurate with the magnitude of power transmitted to the load. In typical situations wherein magnetrons are utilized in communication networks, such a power level precludes the use of relatively small size phase shifters which are capable of rapidly shifting phase, the larger, high powered, phase shifters having a slower response time.

SUMMARY OF THE INVENTION

The aforementioned problem is overcome and other advantages are provided by a tuning circuit for adjusting the radiation frequency of a source of radiation such as a magnetron and similarly constructed crossed field devices, the tuning circuit including, in accordance with the invention, a directional coupler for extracting a fraction of the power provided at the output port of the magnetron. The power is coupled to a load or utilization device via a circulator coupled to the main output port of the directional coupler, and a phase shifter is coupled between the secondary output port and a third terminal of the circulator. Since the directional coupler provides only a small portion of the output power to the phase shifter, the phase shifter may be constructed in a fashion which permits rapid changing of the phase and, therefore, a rapid changing of the impedance reflected back to the magnetron. As a result, the magnetron frequency may be rapidly modulated by the phase shifter. While the tuning circuit is primarily utilized for tuning a magnetron, the circuit may also be used for modulating the frequency of other microwave generators.

BRIEF DESCRIPTION OF THE DRAWINGS

The aforementioned aspects and other features of the invention are explained in the following description taken in connection with the accompanying drawings wherein.

DESCRIPTION OF THE PREFERRED EMBODIMENT

Figure 1:
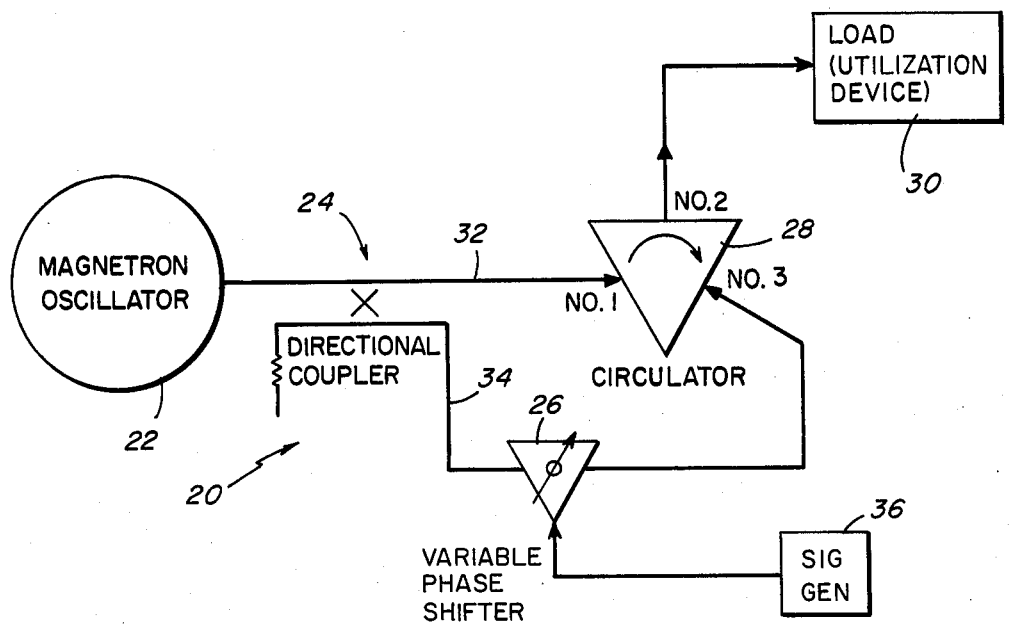
FIG. 1 is a circuit for tuning the magnetron frequency in accordance with the invention.

Referring now to FIG. 1, there is seen a tuning circuit 20 for altering the frequency of a magnetron 22 in accordance with the invention, the circuit 20 comprising a directional coupler 24, a variable phase shifter 26, a circulator 28 and a utilization device which serves as a load 30. A relatively large fraction of the power produced by the magnetron 22 is coupled via the line 32 to the circulator 28, and from the circulator 28 to the load 30. A relatively small fraction of the magnetron power is coupled to the circulator 28 via line 34 and the phase shifter 26. An arrow on the phase shifter 28 indicates the direction of circulation of radiation from the first port at line 32, to the second port which is coupled to the load 30 and to the third port which is coupled to the phase shifter 26.

Figure 2:
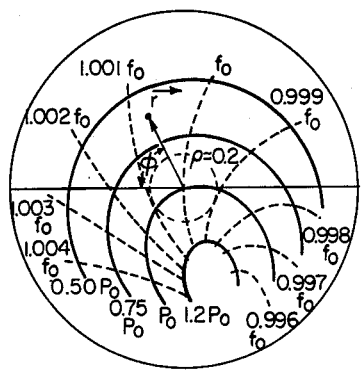
FIG. 2 shows a Rieke diagram useful in explaining the frequency pulling as a function of the reflection coefficient of a load as seen by the magnetron.

Referring also to FIG. 2, it is seen that a change in the reflection coefficient as is measured in the radial coordinate produces a change in the frequency of radiation. The reflection coefficient is represented as a complex number having a phase angle therein and, accordingly, a change in the phase shift produced by the phase shift produced by the phase shifter 26 alters the reflection coefficient with the consequent altering of the frequency. By way of example, the directional coupler 24 may have a coupling coefficient of 13.5 dB (decibels), the phase shifter 26 and the circulator 28 may each have losses of 0.25 dB, in which case the signal reinjected via the third port of the circulator 28 would be reduced in amplitude by 14 dB. The factor of 14 dB for the reinjected signal would have the same effect on the oscillation of the magnetron as would be the case if the magnetron were coupled into a reflective mismatch with a VSWR (voltage standing wave ratio) of 1.5. A variation of 90° in the phase shifter 26 is sufficient to accomplish the desired modulation of the radiation frequency. For example, at a radiation frequency of 2 Ghz (gigahertz), the frequency modulation can have a deviation as large as 5 to 10 MHz (megahertz).

Also shown in FIG. 1 is a signal generator 36 coupled to the phase shiter 26, the signal generator 36 applying a voltage to the phase shifter 26 for varying the phase thereof. By way of example, the phase shifter 26 may be formed of a mechanical construction, a ferrite element or a diode element. The diode element is preferred for use with the generator 36 since the phase shift imparted by the diode is dependent on the voltage applied to the diode. Thereby, a signal of the generator 36 becomes modulated onto the carrier of the signal on line 32.

In operation, therefore, a portion of the output signal of the magnetron 22 is taken from the side arm, or secondary port, of the directional coupler 24, and is then applied via the phase shifter 26 to the circulator 28. By way of example, the circulator 28 may comprise a ferrite element. As a result of the circulation of electromagnetic energy about the circulator 28, energy is fed back into the output port of the magnetron 22. The reinjected signal is a function of the phase shift induced by the phase shifter 26 and has the effect of pulling the magnetron frequency with little change in the amplitude of the output signal of the magnetron 22.

It is understood that the above-described embodiment of the invention is illustrative only and that modifications thereof may occur to those skilled in the art. Accordingly, it is desired that this invention is not to be limited to the embodiment disclosed herein but is to be limited only as defined by the appended claims.

What is claimed is:

1. A tuning circuit for a microwave source comprising:
   a circulator;
   a directional coupler connected between an output port of said source and a first terminal of said circulator, a second terminal of said circulator providing power for a load; and
   a phase shifter connected between said directional coupler and third terminal of said circulator, said directional coupler providing a fraction of the power of the output signal of said source to said phase shifter, the phase of said phase shifter effecting the reflection coefficient of power reflected back into said output port of said source for controlling the frequency thereof.

2. A circuit according to claim 1 further comprising a signal source coupled to said phase shifter for imparting a modulation of the signal of said signal source upon said frequency.

3. A tunable magnetron circuit comprising:
a magnetron;
circulator means;
means for coupling a large fraction of the output power of said magnetron to a first terminal of said circulator, a second terminal of said circulator providing power for a load; and
a phase shifter connected between said coupling means and a third terminal of said circulator, said coupling means coupling a small fraction of said output power of said magnetron to said phase shifter.

4. A circuit according to claim 3 further comprising a signal source coupled to said phase shifter for imparting a modulation of the signal of said signal source upon the signal produced by said magnetron.

* * * * *